United States Patent [19]

Lin et al.

[11] Patent Number: 5,010,037
[45] Date of Patent: Apr. 23, 1991

[54] PINHOLE-FREE GROWTH OF EPITAXIAL COSI$_2$ FILM ON SI(111)

[75] Inventors: True-Lon Lin, Cerritos; Robert W. Fathauer, Sunland; Paula J. Grunthaner, Glendale, all of Calif.

[73] Assignee: California Institute of Technology, Pasadena, Calif.

[21] Appl. No.: 257,758

[22] Filed: Oct. 14, 1988

[51] Int. Cl.$^5$ .............................................. H01L 21/44
[52] U.S. Cl. ................................ 437/200; 437/192; 437/245; 437/247; 437/175; 357/16; 156/620.72
[58] Field of Search ............... 437/175, 189, 200, 176, 437/177, 178, 192, 196, 245, 247; 357/16, 15; 148/DIG. 147; 156/620.72

[56] References Cited

U.S. PATENT DOCUMENTS

| | | | |
|---|---|---|---|
| 4,398,341 | 8/1983 | Geipel, Jr. et al. | 437/192 |
| 4,492,971 | 1/1985 | Bean et al. | 437/175 |
| 4,554,045 | 11/1985 | Bean et al. | 437/189 |
| 4,555,301 | 11/1985 | Gibson et al. | 156/620.72 |
| 4,665,412 | 5/1987 | Ohkawa et al. | 357/16 |
| 4,665,415 | 5/1987 | Esaki et al. | 357/16 |
| 4,707,197 | 11/1987 | Hensel et al. | 437/200 |
| 4,758,534 | 7/1988 | Derkits, Jr. et al. | 437/176 |

OTHER PUBLICATIONS

Hunt et al., "Growth of Epitaxial CoSi$_2$/Si Multilayers", Interfaces, Supperlattices, and Thin Films Symp., Dow, J. D. and I. K. Schuller, eds., Pittsburgh, PA: Matls. Res. Soc., 1987, pp. 351–356.

Rosencher et al., "Realization and Electrical Properties of a Monolithic Metal-Base Transistor: The Silicon/Cobalt Silicide (CoSi$_2$)/Silicon Structure", Physica B&C, vol. 134, No. 1–3, pp. 106–110.

Cros et al., "Low Temperature Amorphous-to-Crystalline Transformation of CoSi$_2$ Films", Appl. Phys. Letts., Apr. 18, 1988, vol. 52, No. 16, pp. 1311–1313.

Kao et al., "Uniformity and Crystalline Quality of Cobalt Disilicide (CoSi$_2$)/Silicon Heterostructures Grown by Molecular Beam Epitaxy and Reactive Deposition Epitaxy", J. Vac. Sci. Technol., B. vol. 3, No. 2, pp. 596–599.

d'Anterroches et al., "Transmission Electron Microscopy Study of the Formation of Epitaxial CoSi$_2$/Si(111) by a Room-Temperature Codeposition Technique", Appl. Phys. Letts., Feb. 8, 1988, vol. 52, No. 6, pp. 434–436.

d'Avitaya et al., "Silicon Overgrowth on CoSi$_2$/Si(111) Epitaxial Structures: Application to Permeable Base Transistor", J. Cryst. Growth, Feb. 1987, vol. 81, No. 1–4, pp. 463–469.

West et al., "Chemical Vapor Deposition of Cobalt Silicide", Appl. Phys. Letts, Aug. 9, 1988, vol. 53, No. 9, pp. 740–742.

Hunt et al., "Control of Pinhole Formation in Epitaxial CoSi$_2$ Films", J. Vac. Sci. Technol. B, May–Jun. 1987, vol. 5, No. 3, pp. 749–750.

Fischer et al., "Growth of Uniform Epitaxial CoSi$_2$ Films on Si(111)", J. of Appl. Phys., Sept. 15, 1988, vol. 64, No. 6, pp. 3005–3013.

d'Avitaya et al., "Silicon MBE: Recent Developments", Surface Science, vol. 168, No. 1–3, pp. 483–497.

Fathauer et al., "Increased Effective Barrier Heights in Schottky Diodes by Molecular-Beam Epitaxy of Cobalt Disilicide and Gallium-Doped Silicon on (111)Si", J. Appl. Phys., vol. 64, No. 8, pp. 4082–4085.

Phillips et al., "Growth of an Epitaxial In-
(List continued on next page.)

Primary Examiner—Brian E. Hearn
Assistant Examiner—M. Wilczewski
Attorney, Agent, or Firm—David W. Collins

[57] ABSTRACT

Pinhole-free epitaxial CoSi$_2$ films (14') are fabricated on (111)-oriented silicon substrates (10) with a modified solid phase epitaxy technique which utilizes (1) room temperature stoichiometric (1:2) codeposition of Co and Si followed by (2) room temperature deposition of an amorphous silicon capping layer (16), and (3) in situ annealing at a temperature ranging from about 500° to 750° C.

14 Claims, 1 Drawing Sheet

OTHER PUBLICATIONS sulator–Metal–Semiconductor Structure on Silicon by Molecular Beam Epitaxy", *Appl. Phys. Letts.*, vol. 48, No. 7, pp. 463–465.

Lin et al., "Room–Temperature Codeposition Growth Technique For Pinhole Reduction in Epitaxial $CoSi_2$ on Si(111)", *Appl. Phys. Letts.*, Mar. 7, 1988, vol. 52, No. 10, pp. 804–806.

Kao et al., "Molecular Beam Epitaxial Growth of Cobalt Disilicide on Porous Silicon", *Appl. Phys. Letts.*, vol. 52, No. 22, pp. 1809–1811.

Ospelt et al., "Electrical Characterization of Epitaxial Cobalt Disilicide/Silicon–Heterostructures", *Helv. Phys. Acta*, vol. 61, No. 1-2, pp. 96–99.

Lien et al., "Comparison of Schottky Barrier Heights of $CoSi_2$ Formed From Evaporated or Crystalline Silicon", *Appl. Phys.* A, vol. 35, 1984, pp. 47–50.

Henz et al., "On the Growth of Cobalt Disilicide and Cobalt Disilicide/Silicon Heterostructures on Si(111)", *Solid State Commun.*, vol. 63, No. 6, 1987, pp. 445–449.

Murarka et al., "Cosputtered Cobalt Silicides on Silicon, Polycrystalline Silicon, and Silicon Dioxide", *J. Appl. Phys.*, Dec. 15, 1984, vol., 56, No. 12, pp. 3404–3412.

Lien et al., "Kinetics of $CoSi_2$ From Evaporated Silicon", *Appl. Phys. A*, vol. 34, 1984, pp. 249–251.

Hellman et al. "Surface Structure of Thin Epitaxial $CoSi_2$ Grown on Si(111)", *Physical Review B*, Jun. 15, 1988, vol. 37, No. 18, pp. 10786–10794.

PINHOLE-FREE GROWTH OF EPITAXIAL COSI₂ FILM ON SI(111)

ORIGIN OF INVENTION

The invention described herein was made in the performance of work under a NASA contract, and is subject to the provisions of Public Law 96-517 (35 U.S.C. 202) in which the Contractor has elected to retain title.

TECHNICAL FIELD

The present invention relates to metal base transistors, and, more particularly, to the formation of $CoSi_2$ films on silicon surfaces oriented along (111).

BACKGROUND ART

Epitaxial $CoSi_2$ films have been grown on Si(111) substrates under ultra-high vacuum conditions using a variety of growth techniques. The most widely used technique is that of solid phase reactive epitaxy (SPRE), in which a pure cobalt layer is deposited at room temperature onto the substrate and then annealed at an elevated temperature.

In addition, the techniques of molecular beam epitaxy (MBE) and reactive deposition epitaxy (RDE) have been examined. In the foregoing methods, either pure cobalt is deposited (the latter technique) or cobalt and silicon atoms are codeposited in stoichiometric ratio (the former technique) onto a silicon substrate held at an elevated temperature.

Thin epitaxial $CoSi_2$ films, about 1 to 100 nm thick, formed by these techniques generally have a high density ($>10^7 cm^{-2}$) of pinholes in the silicide layer, which results in an electrical shorting problem for multilayer structures.

It is known that a modified SPRE technique which utilizes the deposition of an amorphous silicon (a-Si) capping layer following the deposition of pure cobalt prior to annealing helps to reduce the size and density of pinholes to approximately $5 \times 10^6 cm^{-2}$. In the process disclosed herein, a modified solid-phase epitaxy (SPE) technique is used to produce $CoSi_2$ layers on Si(111) which are pinhole-free within a detection limit of $10^3 cm^{-2}$. In contrast to the deposition of pure cobalt used in the modified SPRE technique of the prior art, the modified SPE technique disclosed herein uses the room temperature codeposition of cobalt and silicon in the stoichiometric ratio of 1:2, followed by the deposition of an a-Si capping layer.

The growth of so-called pinhole-free $CoSi_2$ films has been reported, but the pinhole detection limit is generally not specified. The techniques of scanning electron microscopy and transmission electron microscopy have been used in these reports to determine the pinhole density, and these techniques are typically limited to a detection level of about $10^5$ pinholes per $cm^2$. Therefore, the term "pinhole-free" $CoSi_2$ has, in the past, been used to describe $CoSi_2$ films with pinhole densities less than or equal to $\approx 10^5$ pinholes per $cm^2$. In the present disclosure, pinhole-free $CoSi_2$ refers to a film with pinhole density less than $10^3$ per $cm^2$.

Recently, Henz et al, Solid State Communications, Vol. 63, pp. 445-449 (1987) reported a pinhole-free SPE technique employing the stoichiometric codeposition of cobalt and silicon at room temperature, followed by appropriate annealing ($\leq 450°$ C). No a-Si capping layer was used in between the codeposition and the annealing. The low annealing temperature is required for the pinhole-free growth, since the present inventors observed pinholes with densities of $10^7$ to $10^8 cm^{-2}$ in $CoSi_2$ films using this technique, but annealed at temperatures higher than 500° C. The low annealing temperature of $\geq 450°$ C. required for pinhole-free growth in the technique of Henz et al results in $CoSi_2$ films of lower crystalline quality, as evidenced in results by the present inventors using Rutherford backscattering spectroscopy in the channeling mode. Furthermore, $CoSi_2$ films annealed at low temperature have higher resistivity than films annealed at higher temperatures. A $CoSi_2$ film with a high resistivity is less desirable for device applications.

One possible mechanism for silicide pinhole formation is the high surface energy of $CoSi_2(111)$ relative to Si(111). By exposing the underlying silicon surface through the formation of pinholes in the $CoSi_2$ film, the total energy of the epitaxial system can be reduced. One approach to reduce the total energy without pinhole formation is to cover the high energy $CoSi_2$ surface with a silicon cap. However, the prior art a-Si cap technique does not achieve pinhole-free growth, since the a-Si cap is consumed during the silicide formation and the $CoSi_2$ surface is exposed.

Thus, a process is required for the formation of pinhole-free $CoSi_2$ films on Si(111) while retaining high crystalline quality of the subsequent epitaxial growth.

DISCLOSURE OF INVENTION

In accordance with the invention, a modified solid phase epitaxy technique is provided for pinhole-free growth of $CoSi_2$ films on silicon surfaces oriented along (111). The process of the invention comprises room temperature codeposition of cobalt and silicon in stoichiometric ratio (1:2), followed by the deposition of an amorphous silicon capping layer and subsequent in situ annealing at a temperature ranging from about 500° to 750° C.

Since the Co/Si mixture is in a stoichiometric ratio, no additional silicon is consumed from either the substrate or the cap for silicide formation, so that the silicon cap is preserved and covers the high energy $CoSi_2$ surface. Thus, the energetic driving force for pinhole formation is removed, and pinhole-free $CoSi_2$ films can be fabricated with annealing temperatures as high as 750° C. Furthermore, the amorphous silicon cap is converted to crystalline silicon in the annealing process and serves as a template for subsequent silicon overgrowth, which is expected to improve surface morphology.

No pinholes can be detected in the resulting $CoSi_2$ films, with a detection resolution of $10^3 cm^{-2}$. $CoSi_2$ films grown without the silicon cap are found to have a pinhole density of greater than $2 \times 10^7 cm^{-2}$ when annealed at similar temperatures. This is the first pinhole-free growth of epitaxial $CoSi_2$ films at annealing temperatures higher than about 500° C.

BEST MODES FOR CARRYING OUT THE INVENTION

Figure 1:
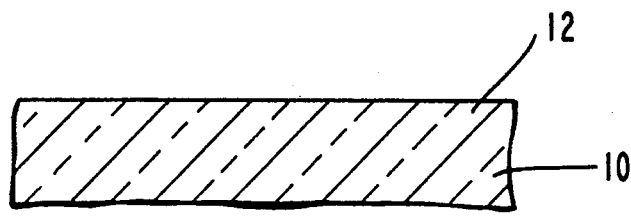
FIGS. 1-4 are cross-sectional views depicting the processing sequence of the invention.

Referring now to the Figures, wherein like numerals of reference designate like elements throughout, a (111)-oriented silicon substrate 10 is shown in FIG. 1. Prior to $CoSi_2$ deposition, the major surface 12 upon which the film is to be deposited is cleaned by well-known techniques.

Co and Si atoms are co-evaporated at a ratio of 1:2, respectively, using two electron gun sources, in a high vacuum environment, with the pressure less than $10^{-9}$ Torr. Other deposition procedures may be used that co-deposit the constituent atoms in a stoichiometric ratio in a clean environment. The deposition temperature is at ambient.

Figure 2:
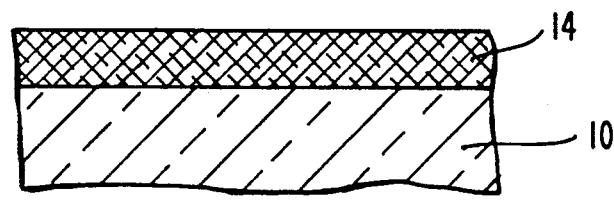

The resulting Co/Si amorphous mixture, depicted as film 14 in FIG. 2, is formed to a thickness ranging from about 1 to 150 nm, and preferably about 5 to 10 nm. The nature of the crystallization process (i.e., solid-phase epitaxy) limits the thickness of high-quality crystalline material that can be obtained. Beyond about 150 nm, the crystalline quality of the $CoSi_2$ layer begins to degrade.

Figure 3:
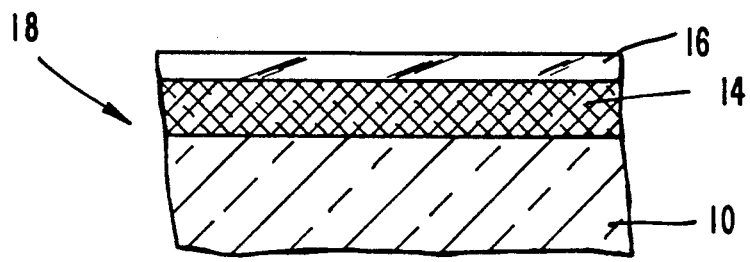
Figure 4:
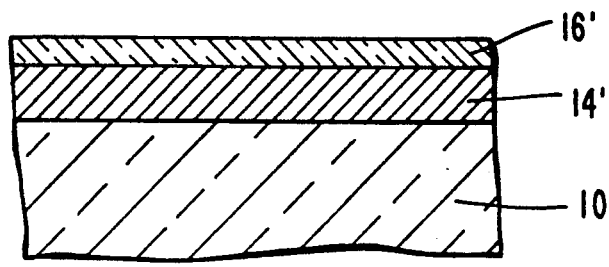

Next, an amorphous layer 16 of silicon is deposited onto the Co/Si amorphous mixture 14, such as by evaporation immediately following formation of the Co/Si amorphous layer. The a-Si layer 16 is formed to a thickness ranging from about 0.5 to 2 nm, and preferably about 1 to 2 nm. The a-Si layer 16 is used to cover the high surface energy silicide layer 14 during the annealing process in order to eliminate pinhole formation. When the a-Si layer is less than about 0.5 nm, the layer is not effective in eliminating the formation of pinholes, presumably due to incomplete surface coverage of the a-Si. There is no advantage gained in depositing an a-Si layer thicker than about 2 nm. The resulting assembly 18 is depicted in FIG. 3. Layer 16 is also deposited at ambient temperature.

Annealing of the assembly 18 is then performed, at a temperature ranging from about 500° to 750° C., and preferably at a temperature ranging from about 550° to 600° C., to form an epitaxial, crystalline layer 14'. It has been found that although epitaxial $CoSi_2$ layers can be formed at annealing temperatures less than 200° C., the crystalline quality of the resulting layers is poor. High crystalline quality material can be obtained for annealing temperatures in the range of about 500° to 750° C. Beyond 750° C., the $CoSi_2$ layer begins to segregate into islands.

The annealing time ranges from about 1 to 60 minutes, and preferably for a time of about 10 to 20 minutes, the longer times generally associated with the lower temperatures. The actual annealing times used for a given annealing temperature were established using reflection high energy electron diffraction to monitor the crystalline perfection of the silicide layer 14. In general, the lower the annealing temperature, the longer it takes for the cobalt and silicon atoms in the codeposited layer 14 to arrange themselves in an epitaxial relationship with the substrate to produce layer 14'.

During the annealing process, the amorphous silicon cap layer 16 is converted to a crystalline silicon layer 16'.

The $CoSi_2$ layers formed by the codeposition technique are of good crystalline quality and occur in type B orientation. Type B orientation is one in which the silicide crystal is rotated 180 about the surface normal. The type A orientation, in which the silicide crystal is not rotated with respect to the underlying substrate, has been observed by others. It is not desirable to have a mixture of A and B grains in the silicide layer, since this will result in an inhomogeneity in the layer properties.

No pinholes are observed for $CoSi_2$ films grown in accordance with the invention. The detection resolution is $10^3$ cm$^{-2}$. In contrast, if the silicon cap 16 is omitted, pinhole densities of $10^7$ to $10^8$ cm$^{-2}$ are observed in the $CoSi_2$ films.

EXAMPLES

The samples described herein were grown in a RIBER EVA 32 Si MBE system with a base pressure of $3 \times 10^{-11}$ Torr. Prior to deposition, Si(111) substrates were cleaned in accordance with a prior art procedure. An in situ silicon beam technique was used to remove the protective oxide remaining after the chemical clean (at a substrate temperature of 700° C. and Si flux of $1 \times 10^{13}$ cm$^{-2}$s$^{-1}$). The substrates were then cooled to room temperature (<100° C.) and Co and Si atoms were co-evaporated at a ratio of 1:2, respectively, from two electron gun sources. The chamber pressure during the deposition process was less than $5 \times 10^{-10}$ Torr Co:Si ratios were previously calibrated by quartz crystal monitors and controlled during deposition by a Sentinel III deposition controller. Amorphous Si layers with thicknesses of 1 to 2 nm were immediately evaporated onto the codeposited layer. Samples were annealed in situ at temperatures ranging from 550° to 600° C. for 10 minutes. Final $CoSi_2$ thicknesses ranged from 5 to 10 nm.

The films were characterized in situ by reflection high-energy electron diffraction (RHEED), and ex situ by transmission electron microscopy (TEM), scanning electron microscopy (SEM), and Rutherford backscattering spectroscopy (RBS). The $CoSi_2$ films were of high crystalline quality and occurred with type B orientation with respect to the underlying silicon substrate. TEM studies revealed that the $CoSi_2$ layers were uniform in thickness and that there was an abrupt $CoSi_2$/Si interface with roughness corresponding to single atomic steps (3 Å). Minimum RBS channeling yields of less than 3% indicated that the $CoSi_2$ films had good crystallinity. The a-Si cap was converted to single-crystal Si in the annealing process as indicated by RHEED patterns. However, the crystalline quality of the Si cap was not characterized by RBS and TEM because of its small dimension (0.5 to 2 nm).

Pinhole formation in $CoSi_2$ layers was studied by utilizing a $CF_4$ plasma etching technique to increase the visibility of the pinholes. This technique selectively etches Si relative to $CoSi_2$ with a selectivity of more than 100 to 1, thereby forming an etched crater in the Si wherever a pinhole in the $CoSi_2$ layer 14 occurs. This crater is large compared to the original size of the pinhole and is easier to detect by conventional scanning electron microscopy techniques. If a Si capping layer is present, it is also removed by the $CF_4$ plasma. The use of this plasma etching technique improved the detection limit to $1 \times 10^3$ pinholes per cm$^2$. The surface morphology of Co-$Si_2$ layers after $CF_4$ plasma etch was studied by SEM. Pinhole densities of $10^7$ to $10^8$ were observed for $CoSi_2$ layers grown without the presence of a capping layer, while no pinholes were observed for $CoSi_2$ films grown with a Si cap. The results are summarized in the Table below.

TABLE

Pinhole Study of $CoSi_2$

| Sample | a-Si cap thickness, nm | $CoSi_2$ thickness, nm | Annealing Temperature, °C. | Pinhole Density, cm$^{-3}$ |
| --- | --- | --- | --- | --- |
| 1 | 2 | 10 | 577 | 0$^a$ |
| 2 | 2 | 10 | 577 | 0 |
| 3 | 1 | 10 | 577 | 0 |
| 4 | 1 | 5 | 577 | 0 |

TABLE-continued

Pinhole Study of $CoSi_2$

| Sample | a-Si cap thickness, nm | $CoSi_2$ thickness, nm | Annealing Temperature, °C. | Pinhole Density, $cm^{-3}$ |
|---|---|---|---|---|
| 5 | NA[b] | 10 | 550 | $1 \times 10^8$ |
| 6 | NA | 10 | 577 | $5 \times 10^7$ |
| 7 | NA | 10 | 550 | $1.3 \times 10^8$ |

[a]Below the detection resolution of $1 \times 10^3 cm^{-3}$ by using the $CF_4$ plasma etch technique
[b]Formed without an a-Si cap.

INDUSTRIAL APPLICABILITY

The process of the invention is expected to find use in the fabrication of metal base transistors.

Thus, there has been disclosed a process for the formation of pinhole-free, high quality, thin films of $CoSi_2$ on Si(111). Various changes and modifications of an obvious nature will occur to those of ordinary skill in this art, and all such changes and modifications are considered to fall within the scope of the invention, as defined by the appended claims.

What is claimed is:

1. A process for epitaxially growing substantially pinhole-free crystalline films of $CoSi_2$ on silicon substrates comprising:
    (a) codepositing at ambient temperature silicon and cobalt atoms in substantially stoichiometric ratio on a major surface of said substrate to form an amorphous film of Co/Si in a 1:2 mixture;
    (b) depositing at ambient temperature a layer of amorphous silicon on said amorphous film to form a composite structure; and
    (c) annealing said composite structure at a temperature ranging from about 500° to 750° C. to form said crystalline film of $CoSi_2$ capped with crystalline silicon.

2. The process of claim 1 wherein said $CoSi_2$ film is deposited to a thickness ranging from about 1 to 150 nm.

3. The process of claim 2 where said $CoSi_2$ film is deposited to a thickness ranging from about 5 to 10 nm.

4. The process of claim 1 wherein said amorphous silicon layer is deposited to a thickness ranging from about 0.5 to 2 nm.

5. The process of claim 4 wherein said amorphous silicon layer is deposited to a thickness ranging from about 1 to 2 nm.

6. The process of claim 1 wherein said annealing is performed for a time ranging from about 1 to 60 minutes.

7. The process of claim 6 wherein said annealing is performed for a time ranging from about 10 to 20 minutes.

8. The process of claim 1 wherein said annealing is performed at a temperature ranging from about 550° to 600° C.

9. A process for epitaxially growing substantially pinhole-free films of $CoSi_2$ on silicon substrates consisting of:
    (a) codepositing at room temperature silicon and cobalt atoms in stoichiometric ratio on a major surface of said substrate to form an amorphous film of Co/Si having a thickness ranging from about 1 to 150 nm;
    (b) depositing at room temperature a layer of amorphous silicon on said amorphous film of Co/Si to form a composite structure, said amorphous silicon film having a thickness ranging from about 0.5 to 2 nm; and
    (c) annealing said composite structure at a temperature ranging from about 500° to 750° C. for a time of about 1 to 60 min.

10. The process of claim 9 where said $CoSi_2$ film is deposited to a thickness ranging from about 5 to 10 nm.

11. The process of claim 9 wherein said amorphous silicon layer is deposited to a thickness ranging from about 1 to 2 nm.

12. The process of claim 9 wherein said annealing is performed for a time ranging from about 10 to 20 minutes.

13. The process of claim 9 wherein said annealing is performed at a temperature ranging from about 550° to 600° C.

14. A process for epitaxially growing substantially pinhole-free films of $CoSi_2$ on silicon substrates consisting of:
    (a) codepositing at room temperature silicon and cobalt atoms in stoichiometric ratio on a major surface of said substrate to form an amorphous film of Co/Si having a thickness ranging from about 5 to 10 nm;
    (b) depositing at room temperature a layer of amorphous silicon on said amorphous film of Co/Si to form a composite structure, said amorphous film having a thickness ranging from about 1 to 2 nm; and
    (c) annealing said composite structure at a temperature ranging from about 550° to 600° C. for a time of about 10 to 20 min.

* * * * *